United States Patent [19]

Campbell

[11] Patent Number: 4,619,567
[45] Date of Patent: Oct. 28, 1986

[54] BIT HOLDER WITH IMPACT RELEASE MECHANISM

[76] Inventor: James H. Campbell, 1210 W. Alameda, Ste. 108, Tempe, Ariz. 85282

[21] Appl. No.: 609,303

[22] Filed: May 11, 1984

[51] Int. Cl.⁴ .............................................. B23C 1/00
[52] U.S. Cl. ................................. 409/234; 279/47; 408/139
[58] Field of Search .......... 408/139, 141, 143, 239 R, 408/239 A, 710, 714; 279/16, 46, 1 A; 409/234; 175/414

[56] References Cited

U.S. PATENT DOCUMENTS

| | | | |
|---|---|---|---|
| 3,035,845 | 5/1962 | Benjamin | 279/47 |
| 3,043,614 | 7/1962 | Eichmann | 279/46 |
| 4,362,161 | 12/1982 | Reimels et al. | 408/139 |

FOREIGN PATENT DOCUMENTS 663490  5/1979  U.S.S.R. ............................ 279/1 A

Primary Examiner—E. R. Kazenske
Assistant Examiner—Willmon Fridie, Jr.
Attorney, Agent, or Firm—Warren F. B. Lindsley

[57] ABSTRACT

A bit holder for automatic printed circuit board drilling machines, the bit holder incorporating a snap ring as a retaining mechanism that releases under abnormally high impact conditions to prevent damage to the bit holder parts.

1 Claim, 13 Drawing Figures

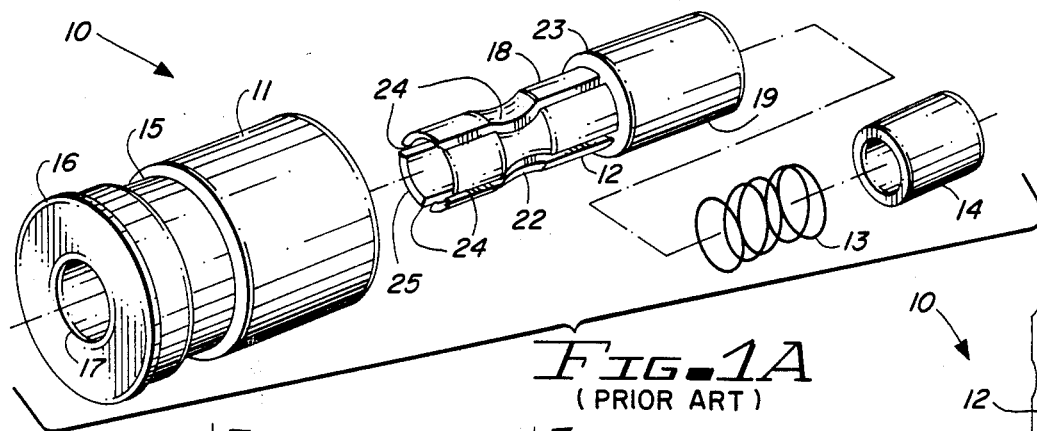
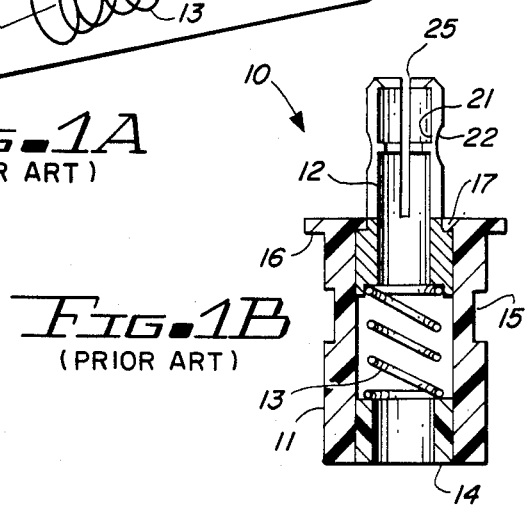
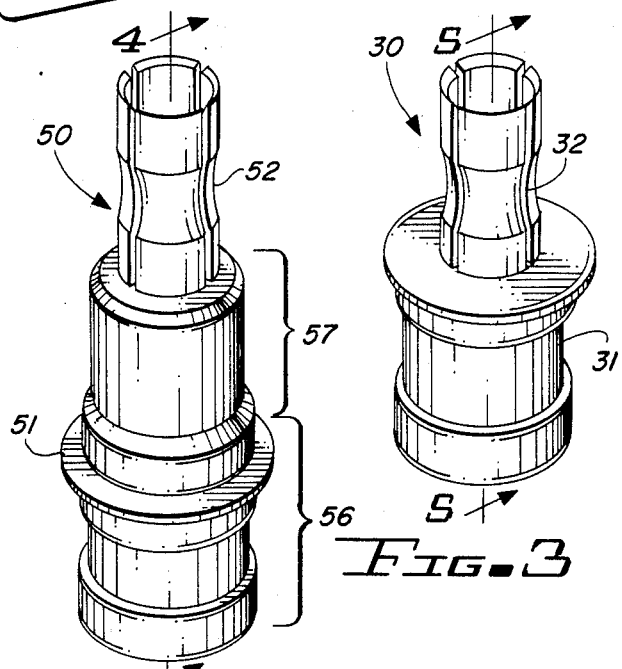
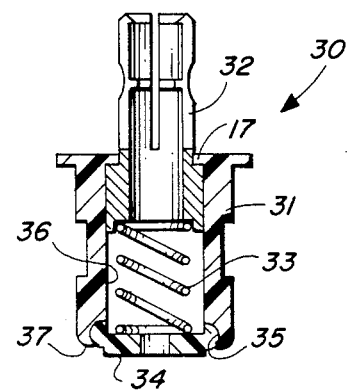
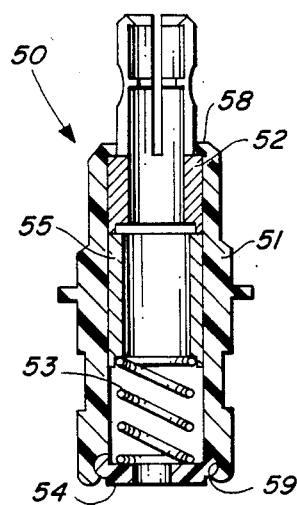
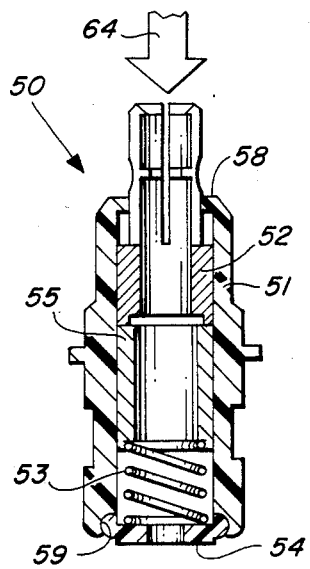
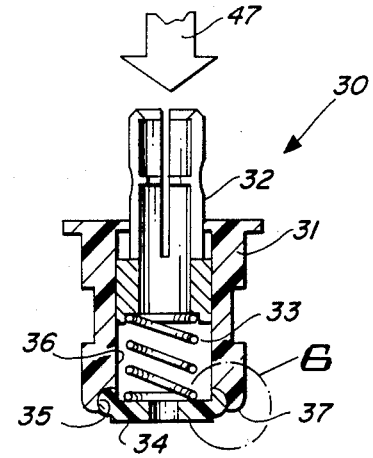

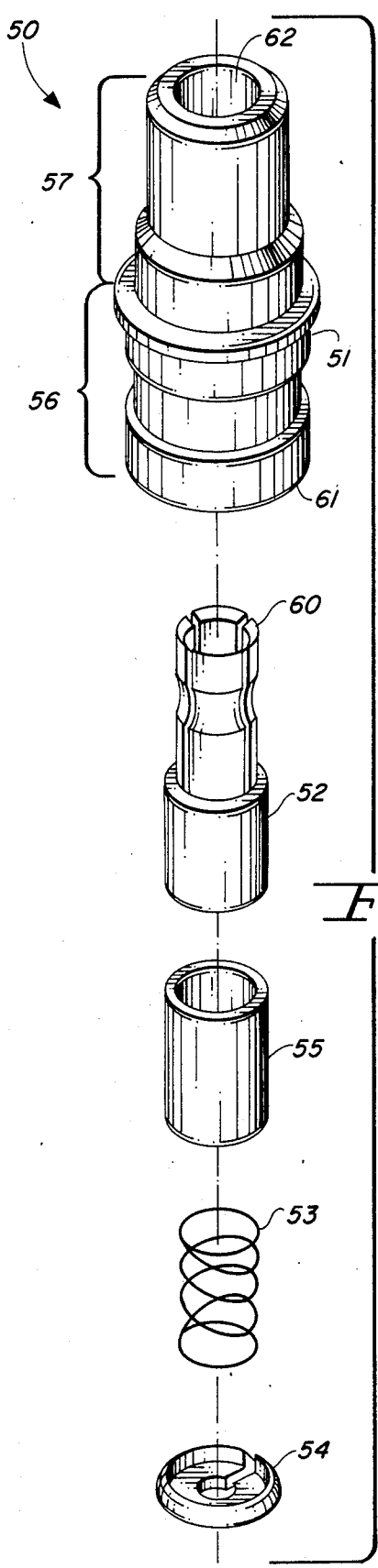
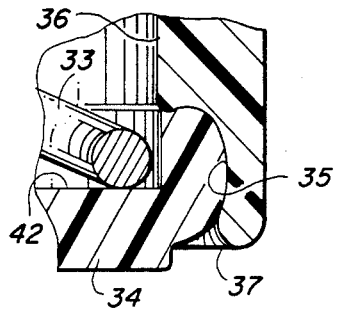
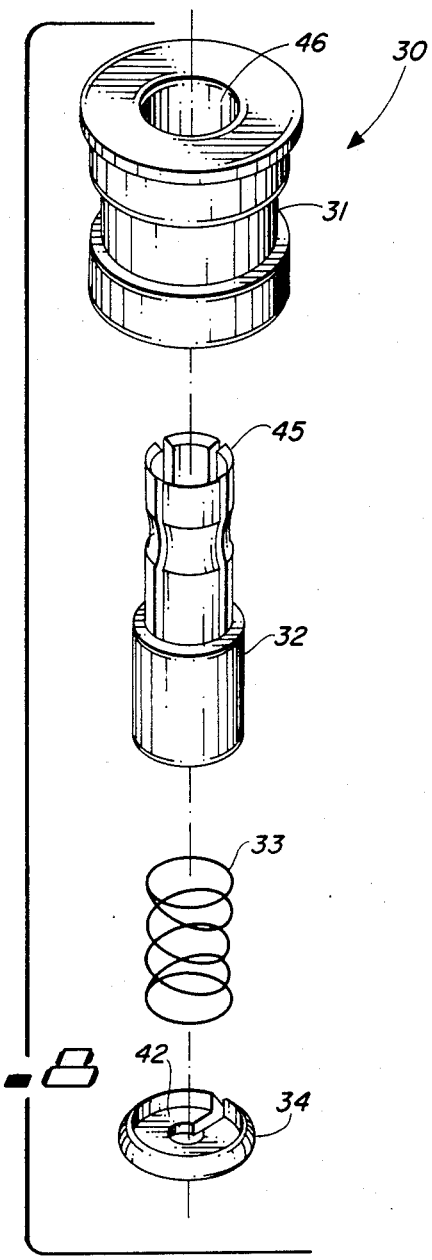
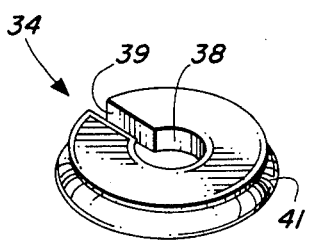
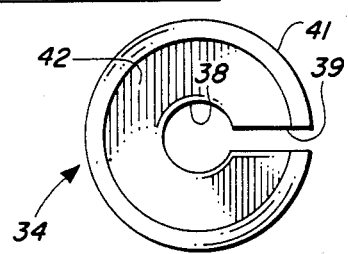

BIT HOLDER WITH IMPACT RELEASE MECHANISM

BACKGROUND OF THE INVENTION

A common element in most electronic equipment is the printed circuit board which comprises a laminated board on which are mounted electronic components such as resistors, capacitors, transistors, integrated circuits, and the like. Alternate layers of the laminated board are etched with copper patterns and electrically insulating layers of such materials as epoxy glass. The etched copper patterns serve as electrical interconnections between mounting holes that are provided for receiving the leads and terminals of electronic components. After the components are mounted, they are soldered in place.

In the manufacture of printed circuit boards, such as the well known "two-sided" board, the etching of the copper patterns is followed by a drilling operation involving the drilling of all of the holes needed for the mounting of the electronic components. On a typical printed circuit board, there may be hundreds of electrical components mounted thereon, each with two or more leads for utilizing integrated circuits involving a variety of hole sizes.

In order to reduce the manual labor and the cost involved in the drilling operation, and in order to assure the required level of accuracy, the drilling operation is usually automatically implemented by a computer-controlled machine operated by a program on a magnetic tape or other digital data storage medium which automatically places the proper hole sizes in all the required locations. The same equipment is also frequently employed for the "routing" of the circuit board, i.e. the cutout of the board at its perimeter from a larger etched board containing a number of identical patterns.

In such automatic drilling equipment, the design of the chuck or bit holder is critical for the proper and cost-effective operation of the equipment. During the process of drilling a single board, the drilling machine might have to change bit sizes several times. The changing of the bit occurs automatically. Responding to programmed controls, one bit is removed and replaced by a bit of a different size. This involves very rapid motion and frequently undesired stresses and impacts are experienced by the bit holder, particularly if the machine motion is not as accurately controlled as it should be. The bit holder must therefore be of a very sturdy and yet resilient construction so that it can withstand such difficult use. In addition, its design must take into account the inevitable failure or destruction of the bit holder after a reasonable period of use and it must accommodate the easy and rapid replacement of the broken holder by a replacement part. Furthermore, for greatest economy, the design of the bit holder should take into account the impacts and stresses to which the holder is frequently subjected, and provision should be made for a minimization of the damage such impacts produce so that repair does not always involve the replacement of expensive parts, but might require only a reassembly of the parts already in use.

Bit holders currently in use are difficult to replace and they are not adequately equipped to cope with high impact conditions frequently experienced as the result of machine malfunctions. The present invention through a relatively minor modification of the existing bit holder achieves significant improvements in the ability of the holder to sustain such impacts without experiencing permanent damage and at the same time facilitates the removal and replacement of a damaged bit holder.

SUMMARY OF THE INVENTION

In accordance with the invention claimed, an improved bit holder is provided for use in atuomatic drilling machines for printed circuit boards, the bit holder incorporating in its design a special retainer ring which releases under excessive impact pressures to minimize damage to the holder and which also facilitates the taking apart and reassembly of the holder as needed to replace any broken or damaged parts.

It is, therefore, an object of this invention to provide an improved bit holder for automatic drilling machines for printed circuit boards.

Another object of the invention is to provide in such a bit holder a means for limiting the impact stresses experienced by vulnerable parts of the bit holder assembly, thereby to minimize damage to such parts during normal or abnormal operation of the machine.

A further object of the invention is to provide in such a bit holder a means for facilitating the taking apart and the reassembly of the holder assembly, thereby reducing the time involved in the replacement of damaged parts or in the reassembly of the holder after an occurrence of excessive impact.

A still further object of the invention is to incorporate in the bit holder assembly a special retainer ring which serves as a pressure release mechanism that acts to limit stresses under conditions of excessive impact forces and which also responds to forces applied intentionally in a disassembly operation to facilitate replacement of damaged parts.

A still further object of the invention is to provide such features in a drill bit holder in a simple and cost-effective manner.

Further objects and advantages of the invention will become apparent as the following description proceeds and the features of novelty which characterize the invention will be pointed out with particularity in the claims annexed to and forming a part of this specification.

BRIEF DESCRIPTION OF THE DRAWINGS

The present invention may be more readily described with reference to the accompanying drawings in which:

FIG. 1A is an exploded perspective view of a prior art bit holder for an automatic drilling machine for printed circuit boards;

FIG. 1B is a cross-sectional view of FIG. 1A;

FIG. 2 is a perspective view of a bit holder involving the invention for use in routing printed circuit boards;

FIG. 3 is a perspective view of another embodiment of the invention illustrating a bit holder intended for use in drilling printed circuit boards;

FIG. 4A is a cross-sectional view of FIG. 2 as viewed along the line 4—4;

FIG. 4B is a cross-sectional view of FIG. 2 as viewed along the line 4—4 with its gripper depressed under the action of an externally applied force;

FIG. 5A is a cross-sectional view of the bit holder of FIG. 3 as viewed along line 5—5;

FIG. 5B is another cross-sectional view of the bit holder of FIG. 3 as viewed along line 5—5 with its gripper depressed under the action of an external force;

FIG. 6 is an enlarged cross-sectional view of a portion of the bit holder of FIGS. 3, 5A and 5B as indicated by the circular region 6 of FIG. 5B;

FIG. 7 is an exploded perspective view of the bit holder of FIG. 2;

FIG. 8 is an exploded perspective view of the bit holder of FIG. 3;

FIG. 9 is a perspective view of a retainer ring employed in the bit holders of FIGS. 2 and 3; and FIG. 10 is a plan view of the retainer ring of FIG. 9.

DESCRIPTION OF THE PREFERRED EMBODIMENT

Referring more particularly to the drawings by characters of reference, FIGS. 1A and 1B disclose a prior art bit holder 10 comprising a housing 11, preferably formed of aluminum, a gripper 12, a spring 13, and a retainer ring 14.

The outer shell 11 has the general shape of a hollow cylinder with an annular depression 15 in its outer surface and a radially extending flange or projection 16 at its forward end. The depression 15 and projection 16 are provided for use in mounting the holder to an automatic drilling machine (not shown). The interior of shell 11 defines an opening having a cylindrical surface of a uniform diameter except at its front end where a radially inwardly extending projection 17 is provided as a retainer for gripper 12.

Gripper 12 has a forward end 18 and a rearward end 19 with the forward end 18 serving as a gripping means for a bit and the rearward end 19 serving as a means for mounting gripper 12 inside of shell 11. Both ends 18 and 19 of the gripper comprise hollow cylindrical shells with their inner cylindircal surfaces being continuous in form except for an annular inwardly extending projection 21 positioned approximately at the center of the forward end 18. The inside diameters of ends 18 and 19 are substantially equal. The outside diameter of rearward end 19 of gripper 12 is constant over its length and is slightly smaller than the inside diameter of shell 11 so that end 19 of gripper 12 may snugly fit into shell 11, but still be able to freely move inside of shell 11. The outside diameter of forward end 18 of gripper 12 is also uniform in diameter over its length except near its center where an annular depression 22 is provided.

The outside diameter of end 18 of gripper 12 is dimensioned so as to permit its passage through and out of the forward end of shell 11. When end 18 is passed through the forward end of shell 11, the reduced inside diameter of shell 11 at projection 17 fits closely about the outside surface of forward end 18 of gripper 12, while shoulder 23 formed on the outside of rearward end 19 at the junction of rearward end 19 with forward end 18 is restrained by projection 17, as shown in FIG. 1B.

Depression 22 is arcuate in shape, as viewed in the longitudinal cross-sectional view of bit holder 10, as seen in FIG. 1B, and arranged juxtapositioned to the inside projection 21. Four longitudinal slots 24 divide the forward end 18 of gripper 12 into four equal quadrants, with the quadrants tending to spread apart as the shaft of a drill or router bit enters into the gripper 12 through its forward end 25 and encounters the arcuate contours of projection 21. The shaft of the drill or router bit may have an annular depression into which projection 21 projects as the shaft reaches its seated position inside gripper 12. This arrangement represents a known conventional design for a beryllium copper gripper of this general configuration.

Spring 13 is an ordinary coil spring designed to work under compression and dimensioned to fit the interior of shell 11.

Retainer ring 14 is a cylindrical aluminum shell with an outside diameter approximately equal to the inside diameter of shell 15.

To assemble bit holder 10, gripper 12 is first inserted into housing 11 with forward end 18 of the gripper entering the rear end of housing 11 and emerging from its front end through projection 16. Spring 13 is then inserted behind gripper 12 and retainer ring 14 is pressed into place behind spring 13, as shown in FIG. 1B. An interference fit between ring 14 and housing 11 holds ring 14 securely in place and the force of spring 13 drives gripper 12 forward with shoulder 23 thereof bearing against projection 17 of housing 11.

In use, the prior art bit holder 10 provides a degree of protection against damage to the bit and to gripper 12 by virtue of the limited spring pressure which holds gripper 12 in its forward position. If the bit or gripper 12 sustains a longitudinal force or impact, spring 13 compresses to absorb the shock.

In the event of a very severe impact, however, spring 13 may be fully compressed against ring 14 and gripper 12 might then be fractured or bent out of shape. When this occurs, gripper 12 must be replaced. To do so, ring 14 must be removed. Because of the tight interference fit necessary to hold ring 14 in place, it is usually necessary to use a hammer or other tool to drive ring 14 from the end of shell 11. The replacement operation is thus relatively difficult and excessively time consuming.

Bit holder 30 of FIGS. 3, 5A, 5B and 6 comprises a first embodiment of an improved bit holder embodying the invention. Bit holder 30 is similar to the prior art bit holder 10, shown in FIGS. 1A and 1B, except that it incorporates a different type of retainer means. Holder 30 comprises a housing 31, a gripper 32, a spring 33 and a snap ring 34, the snap ring 34 serving as the retainer means of FIGS. 1A and 1B.

Gripper 32 and spring 33 are identical with gripper 12 and spring 13 of holder 10, except that gripper 32 is made of chrome-molly spring steel.

Housing 31 is the same as housing 11, except that its rear end is shaped to hold snap ring 34 and it is also somewhat shorter in length than housing 11 because of the smaller dimensions of ring 34 which it needs to accommodate for this difference. As shown in FIGS. 5A, 5B and 6, an annular depression 35 is provided around the inner cylindrical surface 36 of housing 31 at its rearward terminal end 37. As shown in the longitudinal cross-sectional views of FIGS. 5A and 5B, and in the enlarged view of FIG. 6, depression 35 is illustrated as a concave arcuate configuration.

Snap ring 34, as shown most clearly in FIGS. 9 and 10, comprises a disc, the periphery of which is convex, with its outer edge matching in a mating relationship depression 35, as clearly illustrated in FIGS. 5A, 5B and 6. Because the depth of depression 35 is greater near its center than at either its forward or rearward edge, ring 34 is captured by the groove or depression 35 once it is installed therein. In order that ring 34 may withstand its installation in depression 35, it is made of a tough, flexible, resilient self-lubricating material, such as Delrin. To accommodate more readily the degree of deformation required for its installation, ring 34 is provided with a circular aperture or hole 38 through its center with a radial slot 39 extending from hole 38 to its periphery 41. A centered circular depression or cavity 42 is provided in the face of ring 34 that receives the end of spring 33. Cavity 42 serves to center and retain the end of spring 33 and is particularly useful during the assembly of holder 30 as spring 33 is compressed to permit the installation of ring 34.

Assembly of holder 30 is best understood by reference to FIGS. 6 and 8. Gripper 32 is first inserted into housing 31 with its forward end 45 passing through opening 46 at the forward end of housing 31. Spring 33 is then installed into housing 31 behind gripper 32 with the upper end of spring 33 as shown in FIG. 8 engaging the lower end of gripper 32, as shown in FIGS. 5A and 5B. Finally, snap ring 34 is pressed into position behind spring 33 with ring 34 deforming as it is forced into the annular cavity 35. Slot 39 partially closes during installation to allow the necessary reduction in its overall dimensions. Once installed, ring 34 expands toward its unstressed shape and dimensions so that it is securely captured by depression 35 in housing 31.

In use during normal operation, holder 30 performs in a manner similar to the performance of the prior art holder 10. As shown in FIG. 5B, normal operating forces and impacts 47 are absorbed by spring 33 as it compresses, allowing gripper 32 to be driven back into housing 31.

In the event of an abnormally high stress or impact, however, the ability of spring 33 to absorb the energy may be exceeded. When this occurs and spring 33 is fully compressed, the excess energy is transmitted to snap ring 34. Snap ring 34 is designed to be displaced from depression 35 by a force that is only moderately higher than those experienced during normal operation and is thus dislodged by the abnormally high impact. The stresses sustained by gripper 32 and other parts of holder 30 of thus limited to the force required to dislodge ring 34. Damage to holder 30 due to abnormal impact conditions is thus elimitnated or substantially reduced.

The same automatically operated machine that is used for drilling operations on printed circuit boards is also used for routing. In routing a board, a somewhat longer bit holder is required, however, because of clearances required during the routing operation. FIGS. 2, 4A, 4B and 7 illustrate a longer bit holder 50 provided for holding the router bit.

As shown most clearly in FIG. 7, bit holder 50 comprises a housing 51, a gripper 52, a spring 53, a snap ring 54 and a spacer 55. Comparison of FIG. 7 with FIG. 6 reveals that gripper 52, spring 53 and snap ring 54 of holder 50 are identical with gripper 32, spring 33 and snap ring 34, respectively, of holder 30. Holder 50 has a longer housing 51 and it has an additional part in the form of spacer 55.

Housing 51 has a lower end 56 that is identical in its external dimensions with housing 31 of holder 30. A forward extension 57 provides the additional length required in a holder for routing. As shown in FIGS. 4A and 4B, the interior of shell 51 is a continuous cylindrical surface of constant diameter except for an inwardly extending projection 58 at the forward end, and an annular cavity 59 at its rear end. Cavity 59 is indentical with cavity 35 of housing 31.

Spacer 55 is a cylindrical aluminum shell having an outside diameter just smaller than the inside diameter of housing 51 so that it may fit snugly, but still moves therein. The length of spacer 55 is equal to the increased length of housing 51 relative to the length of housing 31.

To assemble holder 51, gripper 52 is first inserted in housing 51, the forward end 60 of gripper 52 first entering the rear end 61 of housing 51 and emerging through opening 62 at the forward end of housing 51. Spacer 55 is then installed behind gripper 52, spring 53 is installed behind spacer 55, and retainer ring 54 is then pressed into place behind spring 53 into cavity 59.

In operation, the performance of holder 50 is the same as that of holder 30. In the unstressed or rest condition as illustrated in FIG. 4A, the spring 53 drives the spacer 55 and the gripper 52 forward to its fully extended position in which projection 58 bears against shoulder 63 on the outer surface of gripper 52. Under the stress of an axial force 64, as shown in FIG. 4B, gripper 52 and spacer 55 are moved rearwardly inside housing 51 thereby compressing spring 53. Spring 53 absorbs normal operating stresses in this manner. Abnormal impacts and forces, as in the case of holder 30, cause snap ring 54 to be dislodged and stresses to the individual parts of holder 50 are limited to the moderate force required to dislodge ring 54.

The addition of spacer 55 to make up for the added length of housing 51 relative to that of housing 31 permits the use of common or identical parts for gripper 32 or 52, spring 33 or 53 and snap ring 34 or 54.

In the event that gripper 32 or 52 does become damaged in use, holder 30 or 50 may readily and quickly be disassembled to replace the damaged parts by simply tapping or pressing the extended forward end of gripper 32 or 52 against a hard surface.

An improved bit holder for an automatic printed circuit board drilling and routing machine is thus provided in accordance with the stated objects of the invention. Although but two embodiments of the invention have been illustrated and described, it will be apparent to those skilled in the art that various changes and modifications may be made therein without departing from the spirit of the invention or from the scope of the appended claims.

What is claimed is:

1. A drill bit holder for automatic drilling machines which limits impact stresses comprising:

an elongated hollow cylindircal-shaped housing, a hollow elongated cylindircally-shaped gripper means for slidably fitting into one end of said housing a predetermined distance with at least a part of it extending axially outwardly of the other end of said housing for gripping a bit, a coiled spring means for slidably fitting into said one end of said housing for bearing at one end against said gripping means, and a disc-shaped snap ring comprising a convex shaped peripheral edge for detachably engaging the inside surface of the hollow interior of said one end of said housing and a face having a centered circular depressing for engaging one end of said spring means for holding said spring means in said housing under tension, said inside surface of the hollow interior or said one end of said housing being provided with an annular groove for receiving in a mating relationship the peripheral edge of said disc-shaped snap ring, said disc-shaped snap ring being formed of a flexible, resilient self-lubricating material and having an aperture extending axially therethrough with a radial slot extending from said aperture to its peripheral edge.

* * * * *

UNITED STATES PATENT OFFICE
CERTIFICATE OF CORRECTION

Patent No. 4,619,567           Dated October 28, 1986

Inventor(s) James H. Campbell

It is certified that error appears in the above-identified patent and that said Letters Patent are hereby corrected as shown below:

Claim 1, line 16, delete "depressing" and substitute ---depression---.

Claim 1, line 19, delete "or" and substitute ---of---.

Signed and Sealed this

Sixth Day of January, 1987

Attest:

DONALD J. QUIGG

Attesting Officer

Commissioner of Patents and Trademarks